US010141937B2

United States Patent

(12) United States Patent
Shankar et al.

(10) Patent No.: US 10,141,937 B2
(45) Date of Patent: Nov. 27, 2018

(54) PULSE-WIDTH MODULATION (PWM) CONTROL LOOP FOR POWER APPLICATION

(71) Applicant: AnDAPT, Inc., San Jose, CA (US)

(72) Inventors: Kapil Shankar, Saratoga, CA (US); Herman Cheung, Cupertino, CA (US); John Birkner, Woodside, CA (US); Patrick J. Crotty, San Jose, CA (US)

(73) Assignee: ANDAPT, INC., San Jose, CA (US)

( * ) Notice: Subject to any disclaimer, the term of this patent is extended or adjusted under 35 U.S.C. 154(b) by 0 days.

(21) Appl. No.: 15/673,142

(22) Filed: Aug. 9, 2017

(65) Prior Publication Data

US 2018/0048318 A1 Feb. 15, 2018

Related U.S. Application Data

(60) Provisional application No. 62/372,738, filed on Aug. 9, 2016.

(51) Int. Cl.

| | |
|---|---|
| ***H03K 19/177*** | (2006.01) |
| ***H03K 7/08*** | (2006.01) |
| ***H02M 3/157*** | (2006.01) |
| *H02M 3/158* | (2006.01) |

(52) U.S. Cl.

CPC ...... *H03K 19/17728* (2013.01); *H02M 3/157* (2013.01); *H03K 7/08* (2013.01); *H03K 19/17744* (2013.01); *H02M 3/1588* (2013.01); *H05K 999/99* (2013.01)

(58) Field of Classification Search

CPC ............... H03K 7/08; H03K 19/17728; H03K 19/17744

See application file for complete search history.

(56) References Cited

U.S. PATENT DOCUMENTS

| | | | | |
|---|---|---|---|---|
| 6,204,939 | B1 * | 3/2001 | Lin | H04N 1/6058 358/1.9 |
| 6,411,915 | B1 * | 6/2002 | Nguyen | F01D 21/003 382/294 |
| 7,711,328 | B1 * | 5/2010 | Samad | H03L 7/0995 375/376 |
| 9,777,733 | B2 * | 10/2017 | Stiles, Jr. | F04D 15/0066 |
| 2002/0114230 | A1 * | 8/2002 | Kadlec | G11B 7/0945 369/44.29 |
| 2002/0180677 | A1 * | 12/2002 | Koyama | G09G 3/20 345/88 |

(Continued)

*Primary Examiner* — Alexander H Taningco
*Assistant Examiner* — Kurtis R Bahr
(74) *Attorney, Agent, or Firm* — Innovation Counsel LLP

(57) ABSTRACT

A method includes: receiving error signals from a signal wrapper of a programmable fabric, wherein the programmable fabric and the signal wrapper are integrated in a programmable logic device (PLD); looking up one or more lookup tables storing rows of pre-calculated data and obtaining a matching pre-calculated data corresponding to the error signals; and generating a compensated output signal using the matching pre-calculated data to drive a switch of the power regulator. The pre-populated data stored in the one or more lookup tables are programmably changed by programming a plurality of parameters of the programmable fabric and loading the pre-populated data to the one or more lookup tables via the signal wrapper.

20 Claims, 14 Drawing Sheets

(56) References Cited

U.S. PATENT DOCUMENTS

2007/0002380 A1* 1/2007 Metcalfe .............. H04N 1/4052 358/3.03
2008/0152037 A1* 6/2008 Kim ...................... H03F 1/3247 375/297
2008/0204072 A1* 8/2008 Sasao ............... H03K 19/17728 326/38
2009/0295341 A1* 12/2009 Nakamura .......... H02M 3/1588 323/222
2010/0024517 A1* 2/2010 Ratner .................... G01L 15/00 73/1.57
2016/0134289 A1* 5/2016 Lesea ............... H03K 19/17772 326/38
2017/0005690 A1* 1/2017 Gregory ................... H04B 1/40

* cited by examiner

680

PULSE-WIDTH MODULATION (PWM) CONTROL LOOP FOR POWER APPLICATION

CROSS-REFERENCE TO RELATED APPLICATION(S)

This application claims the benefits of and priority to U.S. Provisional Patent Application Ser. No. 62/372,738 filed Aug. 9, 2016, the disclosure of which is incorporated herein by reference in its entirety. In addition, this application relates to a co-pending U.S. patent application Ser. No. 15/656,972 entitled "COMPENSATION MEMORY (CM) FOR POWER APPLICATION" and filed Jul. 21, 2017 and claiming the benefits of and priority to U.S. Provisional Patent Application Ser. No. 62/365,327 filed Jul. 21, 2016, the disclosure of which is incorporated herein by reference in its entirety.

TECHNICAL FIELD

The present disclosure relates generally to programmable logic devices (PLDs), more particularly, to a system and method for providing a pulse-width modulation (PWM) control loop for a power application.

BACKGROUND

Programmable logic devices (PLDs) such as programmable logic array (PLA) devices, programmable array logic (PAL) devices, and field-programmable gate arrays (FPGAs) have been in the market place for a long time. These PLDs can be programmed by users for a wide variety of applications and industries. Functional blocks have been integrated to expand the capabilities of the PLDs. These functional blocks can be digital and/or analog that are designed to perform specific functions to complement or supplement the programmable components of the PLDs.

PLDs can have internal elements or fabrics that are programmable and connected together to perform a specific function. More complex devices can add functional blocks to the programming fabrics. These functional blocks can be a combination of digital and analog circuitry, such as a serial interface, a voltage reference, a comparator, an analog-to-digital (A/D) converter, etc. Some devices can be optimized for speed, power, flexibility, complexity, and/or cost. These devices can interface with the external world via input/output (I/O) pins. These I/O pins can typically function up to 5V and sourcing/sinking current up to 50 mA.

Some power applications such as a power regulator and a power converter may require a higher voltage and/or a higher current that the devices and their I/O pins can handle. Users can add an external discrete high-voltage power MOSFET to an existing PLD to expand its application to high-voltage/current power applications. The discrete high-voltage power MOSFET requires another package, adding more cost and requiring more board space.

SUMMARY

A method includes: receiving error signals from a signal wrapper of a programmable fabric, wherein the programmable fabric and the signal wrapper are integrated in a programmable logic device (PLD); looking up one or more lookup tables storing rows of pre-calculated data and obtaining a matching pre-calculated data corresponding to the error signals; and generating a compensated output signal using the matching pre-calculated data to drive a switch of the power regulator. The pre-populated data stored in the one or more lookup tables are programmably changed by programming a plurality of parameters of the programmable fabric and loading the pre-populated data to the one or more lookup tables via the signal wrapper.

The above and other preferred features, including various novel details of implementation and combination of events, will now be more particularly described with reference to the accompanying figures and pointed out in the claims. It will be understood that the particular systems and methods described herein are shown by way of illustration only and not as limitations. As will be understood by those skilled in the art, the principles and features described herein may be employed in various and numerous embodiments without departing from the scope of the present disclosure.

BRIEF DESCRIPTION OF THE DRAWINGS

The accompanying drawings, which are included as part of the present specification, illustrate the presently preferred embodiment and together with the general description given above and the detailed description of the various embodiments given below serve to explain and teach the principles described herein.

Figure 1:
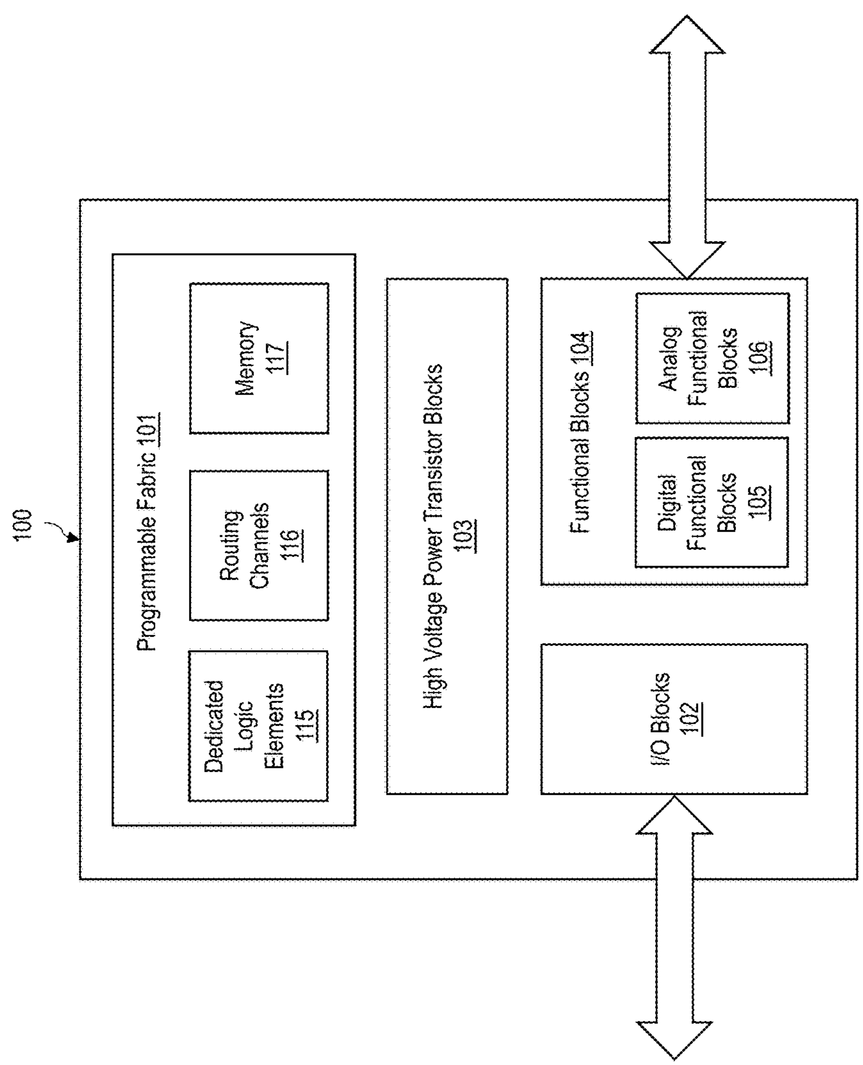
FIG. 1 shows a block diagram an example programmable logic device, according to one embodiment.

The figures are not necessarily drawn to scale and elements of similar structures or functions are generally represented by like reference numerals for illustrative purposes throughout the figures. The figures are only intended to facilitate the description of the various embodiments described herein. The figures do not describe every aspect of the teachings disclosed herein and do not limit the scope of the claims.

DETAILED DESCRIPTION

Each of the features and teachings disclosed herein can be utilized separately or in conjunction with other features and teachings to provide a memory integrated in a PLD used for compensating signals in a power application. Representative examples utilizing many of these additional features and teachings, both separately and in combination, are described in further detail with reference to the attached figures. This detailed description is merely intended to teach a person of skill in the art further details for practicing aspects of the present teachings and is not intended to limit the scope of the claims. Therefore, combinations of features disclosed in the detailed description may not be necessary to practice the teachings in the broadest sense, and are instead taught merely to describe particularly representative examples of the present teachings.

In the description below, for purposes of explanation only, specific nomenclature is set forth to provide a thorough understanding of the present disclosure. However, it will be apparent to one skilled in the art that these specific details are not required to practice the teachings of the present disclosure.

Some portions of the detailed descriptions herein are presented in terms of algorithms and symbolic representations of operations on data bits within a computer memory. These algorithmic descriptions and representations are used by those skilled in the data processing arts to effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the below discussion, it is appreciated that throughout the description, discussions utilizing terms such as "processing," "computing," "calculating," "determining," "displaying," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The algorithms presented herein are not inherently related to any particular computer or other apparatus. Various general-purpose systems, computer servers, or personal computers may be used with programs in accordance with the teachings herein, or it may prove convenient to construct a more specialized apparatus to perform the required method steps. The required structure for a variety of these systems will appear from the description below. It will be appreciated that a variety of programming languages may be used to implement the teachings of the disclosure as described herein.

Moreover, the various features of the representative examples and the dependent claims may be combined in ways that are not specifically and explicitly enumerated in order to provide additional useful embodiments of the present teachings. It is also expressly noted that all value ranges or indications of groups of entities disclose every possible intermediate value or intermediate entity for the purpose of an original disclosure, as well as for the purpose of restricting the claimed subject matter. It is also expressly noted that the dimensions and the shapes of the components shown in the figures are designed to help to understand how the present teachings are practiced, but not intended to limit the dimensions and the shapes shown in the examples.

The present disclosure generally describes a programmable logic device (PLD) integrated with various building blocks for providing a power solution and minimizing cost to market and a board space. In particular, the present disclosure relates to a compensation memory block integrated in the PLD and a signal compensation scheme using the compensation memory block. The compensation memory block can be used to generate a compensated output signal using one or more lookup tables that store pre-calculated data to improve I/O performance and efficiency for a target application (e.g., a power regulator) of the PLD.

The present PLD can provide a power management platform for high-voltage and high-power applications such as power management, power convertors, industrial control, automobile, etc. using one or more integrated power blocks. The present PLD can be used to integrate dissimilar rails on a single chip.

The PLD can be configured as various types of regulators, switches, muxes, battery chargers, switching controllers, gate drivers, etc. Example configurations of the PLD include, but are not limited to, a buck regulator (current or voltage mode), a boost regulator, a multiphase buck regulator (current or voltage mode), a buck-boost regulator (voltage mode), a source side regulator, a drain-side regulator, a push-pull DDR regulator, a load switch, a battery charger (trickle constant current or constant voltage, power path).

Each of the power blocks integrated in the present PLD has an on-demand topology for use in various applications. The present PLD can lower the power consumption by on-demand power on/off and sequencing rails, and on-demand monitoring to handle throttle conditions and marginal loads. In one embodiment, the present PLD can be configured as an on-demand multiple point-of-load (POL) integrator in various forms of power converters such as a point-of-load (POL) converter, a POL regulator, a POL module, and a POL system. Depending on a target application, the PLD can be programmed to function as an integrator combining one or more of a buck regulator (either current or voltage-mode), a boost regulator, a buck-boost regulator, a low drop-out (LDO) regulator, a load switch, a mux, a battery charger, an external switching controller, and a gate driver. The PLD can also be programmed to function as a pulse-width modulator (PWM) for providing constant current (CC) in a current-mode or a constant voltage (CV) in a voltage-mode, a pulse frequency modulator (PFM), or a pulse skipping modulator (PSM).

The present PLD can integrate one or more applications targeted for dissimilar rails to reduce a board size and lower a package cost. The present PLD enables a telemetry across different rails using one or more generic interfaces such as general-purpose input/output (GPIO), I2C interface, and serial peripheral interface (SPI) over the digital and analog I/O pins that can include physical pads. Using one or more of these interfaces or over a power management bus (e.g., PMBus™), the present PLD can communicate with an external device for a telemetry and a remote control. The present PLD can use the telemetry and the remote control for creating and integrating multiple dissimilar POLs. The present PLD can provide digital multiphase operation, for example, auto align/spread phases.

According to one embodiment, the present PLD can be configured as a digital controller. A typical analog controller uses discrete analog circuit components such as resistors, capacitors, and operational amplifiers to generate a control output. The control output is used to command a system's output to match a reference. The analog controller is continuous in nature and lends itself to analysis with Laplace transform tools such as Bode plots. In its simplest form, the present PLD can be configured as a digital controller that implements an analog control with difference equations.

FIG. 1 shows a block diagram an example programmable logic device (PLD), according to one embodiment. The PLD 100 includes a programmable fabric 101, one or more I/O blocks 102, one or more high voltage power transistor blocks 103, and one or more functional blocks 104. In some embodiments, the PLD 100 is referred to as a power management integrated circuit (PMIC). The PMIC can convert one or more low power voltage inputs to one or more high power voltage outputs or convert one or more high voltage inputs to one or more low power voltage outputs.

The programmable fabric 101 includes a number of uncommitted programmable logic elements including one or more dedicated logic elements 115 and routing channels 116. The dedicated logic elements 115 can include a plurality of flip flops and logic gates. The dedicated logic elements 115 and the routing channels 116 of the programmable fabric 101 can be programmed to selectively and programmably connect the I/O blocks 102, the high voltage power transistor blocks 103, and the dedicated logic elements 115 via the routing channels 116 to form one or more dedicated functions.

The programmable fabric 101 can include a memory 117 including a volatile memory (e.g., a static random-access memory (SRAM)), a non-volatile memory (e.g., a flash memory), or both. The memory 117 may include one or more look-up tables for digital compensation.

The I/O blocks 102 can include one or more digital and/or analog inputs and output buffers. Each of the I/O blocks 102 can receive signals from and transmit signals to an external device in a configurable voltage and current. In one embodiment, the I/O blocks 102 can handle signals of a low voltage (up to 5V) and low current (up to 50 mA).

The PLD 100 can include any number of high voltage power transistor blocks, for example, four, eight, and twelve depending on a size of the chip and requirement for an intended application. The high voltage power transistor blocks 103, herein also referred to as scalable integrated MOSFET (SIM) blocks, can be configured and programmed to be a constituent block or element of a more complex circuit or device. In one embodiment, the high voltage power transistor blocks 103 can support voltages ranging from 12V to 80V and current up to 12 A. The voltage and current limits that the high voltage power transistor blocks 103 can support may vary depending on an intended power application and the process technology used for manufacturing the PLD 100. According to one embodiment, the high voltage power transistor blocks 103 can integrate both n-channel and p-channel FETs.

According to one embodiment, the source and the drain of each the high voltage power transistors in the high voltage power transistor blocks 103 can be connected to external circuits and/or devices. The I/O pins of the I/O blocks 102 are primarily used for interfacing digital and analog sensory signals to and from an external device or component, and may not include the source and drain (or boost pin) of the high voltage power transistors. The presence of one or more high voltage power transistors on the same chip can provide flexible configurations of the PLD 100 by programming the programmable fabric 101. For example, different high voltage power transistors on the same chip can connect to different external power rails or sensor hubs. In another example, the high voltage power transistors can be externally connected in series via the source and the drain of the high voltage power transistors. The programmable fabric 101 can be programmed to connect the I/O blocks 102, the high voltage power transistor blocks 103, and the integrated logic elements 115 using the programmable routing channels 116 in various configurations to accommodate a wide range of power applications.

The functional blocks 104 can include one or more of digital functional blocks 105, analog functional blocks 106, or a combination of both. A digital functional block 105 can provide dedicated functions such as a serial interface, a communication protocol, and an application-specific control function. An analog functional block 106 can be an analog-to-digital converter (ADC), a comparator, a sensor, an amplifier, a voltage reference, a digital-to-analog converter (DAC), etc. The parameters of each of these functional blocks 104 such as a gain, a reference voltage, a frequency, a resolution can be configured by the programmable fabric 101. In addition, the programmable fabric 101 can programmably connect different functional elements within the functional blocks 104. Some of the functional blocks 104 such as a reference voltage can be available via external pins of the I/O blocks 102.

According to one embodiment, the programmable fabric 101 can take a form of a field programmable gate array (FPGA). The FPGA contains an array of programmable logic blocks (e.g., the dedicated logic elements 115) and reconfigurable interconnects (e.g., the routing channels 116) to programmably wire the logical blocks together using the reconfigurable interconnects. The logic blocks may include simple logic gates like AND gates and XOR gates and flip-flops or more complex blocks such as memory elements. The logic blocks and the reconfigurable interconnects can be configured to perform complex combinational functions in conjunction with the functional blocks 104.

According to one embodiment, the programmable fabric 101 may include a digital fabric and an analog fabric. The digital fabric corresponds to a portion of the programmable fabric 101 that provides digital interfaces among the constituent blocks including the I/O blocks 102, the high voltage power transistor blocks 103, and the digital functional blocks 105. For example, the digital fabric can provide the connectivity among the integrated analog blocks, digital logic elements, timers, I/Os, etc. The analog fabric corresponds to a portion of the programmable fabric 101 to provide analog interfaces with one or more external telemetry and sensor blocks, an I2C interface, an SPI interface, etc.

According to one embodiment, a high voltage power transistor implemented in the high voltage power transistor blocks 103 is a software-defined and programmable, configurable, optimizable, and scalable power MOSFET. The PLD 100 including such power MOSFETs can accelerate time to market for new products and standards and achieve a competitive response while lowering the capital and operational expenditure, and inventory. The programmability of the present PLD can provide flexibility in design and facilitate the implementation of user-configurable and field-programmable solutions and topologies in a developmental stage of a new product as well as in a commercialization stage for providing optimizable solutions to customers by offering flexible solutions depending on the needs and requirements of a target application.

The present PLD includes one or more analog functional blocks that are adaptive for providing various user-configurable analog functions. The adaptive analog blocks are wrapped with respective signal wrappers on the programmable fabric. The programmable fabric provides a programmable environment to build user-configurable custom analog functions by digitally or combining one or more adaptive analog blocks by selectively and programmably interconnecting and combining the signal wrappers that provide interface to the adaptive analog blocks. The signal wrappers of the adaptive analog blocks eliminate the need to directly interconnect and/or interface analog blocks in an analog fashion with a variety range of voltages, currents, common mode, isolation, noise isolation issues, or the like. Using the present adaptive analog blocks, analog functions can be readily built on demand targeting specific applications while meeting the requirements for the target applications.

According to one embodiment, the present disclosure provides an analog and digital adaptive platform for implementing various analog functions using adaptive analog blocks that are configurable and programmable in a digital domain. The adaptive analog blocks that are wrapped with signal wrappers can provide ease of fabrication and packaging various custom analog functions in a small chip size with a low cost compared to conventional analog ICs. The present adaptive platform can provide flexibility and adaptability for various circuit designs and implementing on-demand analog functions adaptable to various applications on a single chip.

Examples of analog functions that the present adaptive platform can provide include, but are not limited to, switching converters, linear regulators, load switches, battery chargers, and external switching controllers. Beyond power applications, a broad spectrum of applications that the present adaptive platform is applicable to includes Internet of Things (IoT) devices, drones, electric vehicles (EVs), robotics, and various industrial applications utilizing external sensors for proximity, motion, position, tachometer, pitch, axis, yaw, light, pressure, temperature, humidity. The signal wrapper of the present adaptive platform can provide a digital PID control to various analog actuators including, but not limited to, DC motors, servo motors, stepper motors, motion control, breakers, fan controllers.

Figure 2A:
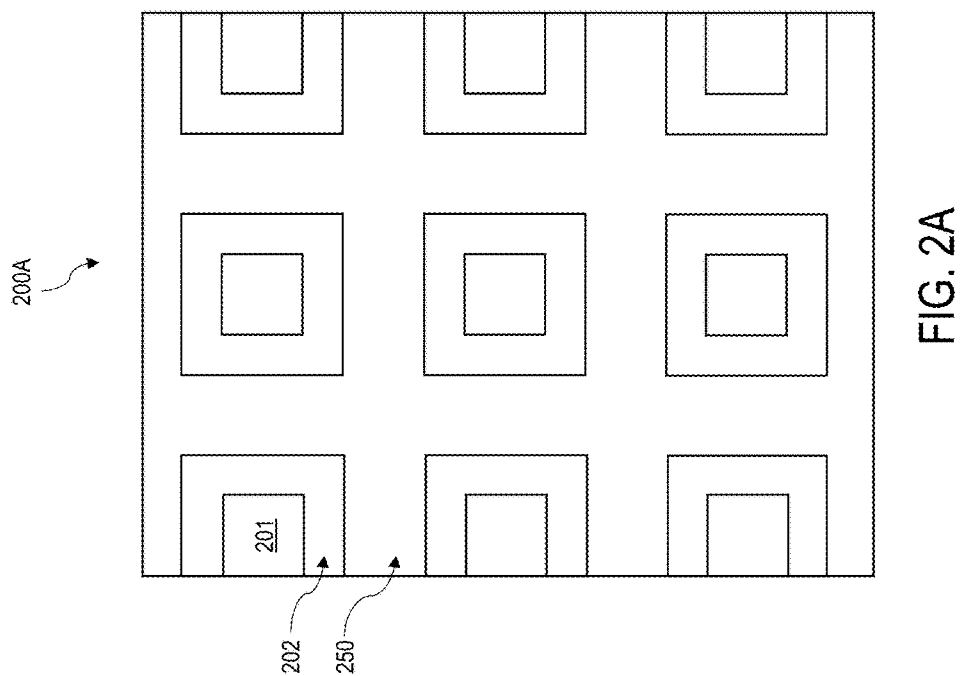
FIG. 2A illustrates a schematic block diagram of an analog and digital adaptive platform, according to one embodiment.

FIG. 2A illustrates a schematic block diagram of an analog and digital adaptive platform, according to one embodiment. The analog and digital adaptive platform 200A includes a plurality of analog and digital adaptive blocks 201 interconnected with signal wrappers 202 on a programmable fabric 250. Referring to FIG. 1, the adaptive blocks 201 correspond to any of the high voltage power transistor blocks 103, the digital functional blocks 105, and the analog functional blocks 106. Each of the adaptive blocks 201 arranged on the programmable fabric 250 is user-configurable and programmable by the coupled signal wrapper 202 to provide a user-configurable function for a target application or one or more circuit components of a target application.

A signal wrapper 202 provides an interface circuitry required for the coupled adaptive block 201 to interconnect with another adaptive block 201 and/or an I/O block (e.g., I/O block 102 of FIG. 1) via the programmable fabric 250. According to one embodiment, the analog and digital adaptive platform 200A includes a predetermined number of adaptive blocks 201. Examples of the adaptive blocks 201 include, but are not limited to, an analog-to-digital converter (ADC) block, a comparator block, a memory block, a pulse-width modulation (PWM) block, a voltage reference block, and a timer block. In conjunction with one or more programmable analog and digital input/output (I/O) blocks (e.g., the I/O blocks 102 of FIG. 1), these adaptive blocks 201 can be programmably configured to build a variety of analog circuitry for various applications via the programmable fabric 250.

According to one embodiment, a signal wrapper 202 can include both a digital wrapper for providing interfaces for digital signals and an analog wrapper for providing interfaces for analog signals to the corresponding adaptive blocks 201. The programmable fabric 250 can include a digital fabric and an analog fabric. In this case, the digital wrapper of the signal wrapper 202 interfaces with the digital fabric of the programmable fabric 250, and the analog wrapper of the signal wrapper 202 interfaces with the analog fabric of the programmable fabric 250.

According to one embodiment, each of the adaptive blocks 201 or a combination of multiple adaptive blocks 201 is programmed over the programmable fabric 250 to build a variety of analog circuitry for various power applications. Examples of such power applications include, but are not limited to a switching converter, a linear regulator, a load switch, a sensor, a battery charger, and an external switching controller. According to other embodiments, each of the adaptive blocks 201 or a combination of multiple adaptive blocks 201 is programmably configured to build a variety of analog circuitry for various non-power applications. Examples of non-power applications include, but are not limited to, an Internet of Things (IoT) device, a drone, an electric vehicle (EV), a robot, and various industrial applications utilizing one or more external sensors for sensing proximity, motion, position, tachometer, pitch, axis, yaw, light, pressure, temperature, humidity, etc. In conjunction with the adaptive blocks 201 and one or more of functional blocks (e.g., the functional blocks 104 of FIG. 1) and I/O blocks (e.g., the I/O blocks 102 of FIG. 1), the signal wrappers 202 of the analog and digital adaptive platform 200A can provide a digital proportional-integral-derivative (PID) control to various analog actuators including, but not limited to, a DC motor, a servo motor, a stepper motor, a motion control, breakers, and a fan controller.

Figure 2B:
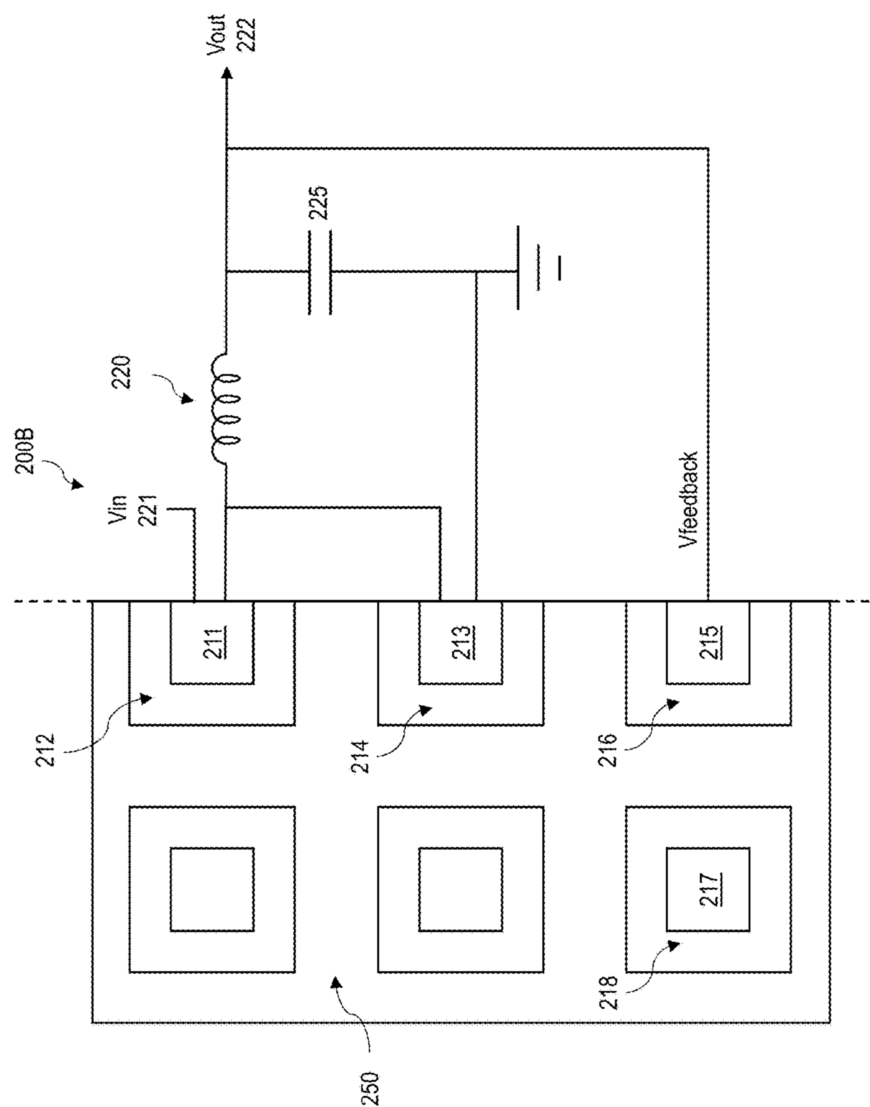
FIG. 2B illustrates an example of the analog and digital adaptive platform of FIG. 2A configured as a hysteretic mode buck switching converter, according to one embodiment.

FIG. 2B illustrates an example of the analog and digital adaptive platform of FIG. 2A configured as a hysteretic mode buck switching converter, according to one embodiment. The hysteretic mode buck switching converter 200B may also be referred to as a bang-bang buck switching converter. The hysteretic mode buck switching converter 200B is a DC-to-DC step-down power converter that converts an input voltage Vin 221 to an output voltage Vout 222 that is lower than the input voltage. The output current may be stepped up while the input voltage is stepped down. The hysteretic mode buck switching converter 200B can provide an efficient power conversion compared to a linear regulator that lowers the input voltage by dissipating power as heat without stepping up the output current.

The analog and digital adaptive platform 200B can be an example of the analog and digital adaptive platform 200A shown in FIG. 2A. For example, the adaptive blocks 211, 213, 215 and 217 are instances of the adaptive blocks 201 of FIG. 2A, the signal wrappers 212, 214, 216, and 218 are instances of the signal wrapper 202 of FIG. 2A. Each of the adaptive blocks 211, 213, 215 and 217 can be one of a comparator block, a memory block, a PWM block, a voltage reference block, and a timer block.

In the present example, the adaptive block 215 is a comparator block. According to one embodiment, the comparator block is included in the analog functional blocks 106 of FIG. 1. The adaptive blocks 211 and 213 drive a filter including an inductor 220 and a capacitor 225 in a synchronous mode. The feedback voltage, $V_{feedback}$, of the filter output 222 (e.g., 1.0V, 4 A) is connected to the comparator block 215. Various internal connections and routing channels are configured to interconnect the adaptive blocks 211, 213, 215 and 217. For example, the adaptive block 217 and the adaptive block 215 are interconnected using the signal wrapper 218 that provides a digital interface to the adaptive block 217, and the signal wrapper 216 that provides a digital interface to the adaptive block 215 via the programmable fabric 250. In a similar fashion, the adaptive block 217 and the adaptive block 213 can be interconnected with the signal wrapper 218 and signal wrapper 214, and the adaptive block 217 and the adaptive block 211 can be interconnected with the signal wrapper 218 and the signal wrapper 212 via the programmable fabric 250. In this example, the adaptive blocks 211, 213, 215 and 217 are configured as a hysteretic mode buck switching converter to provide a stepped-down voltage output.

Figure 3A:
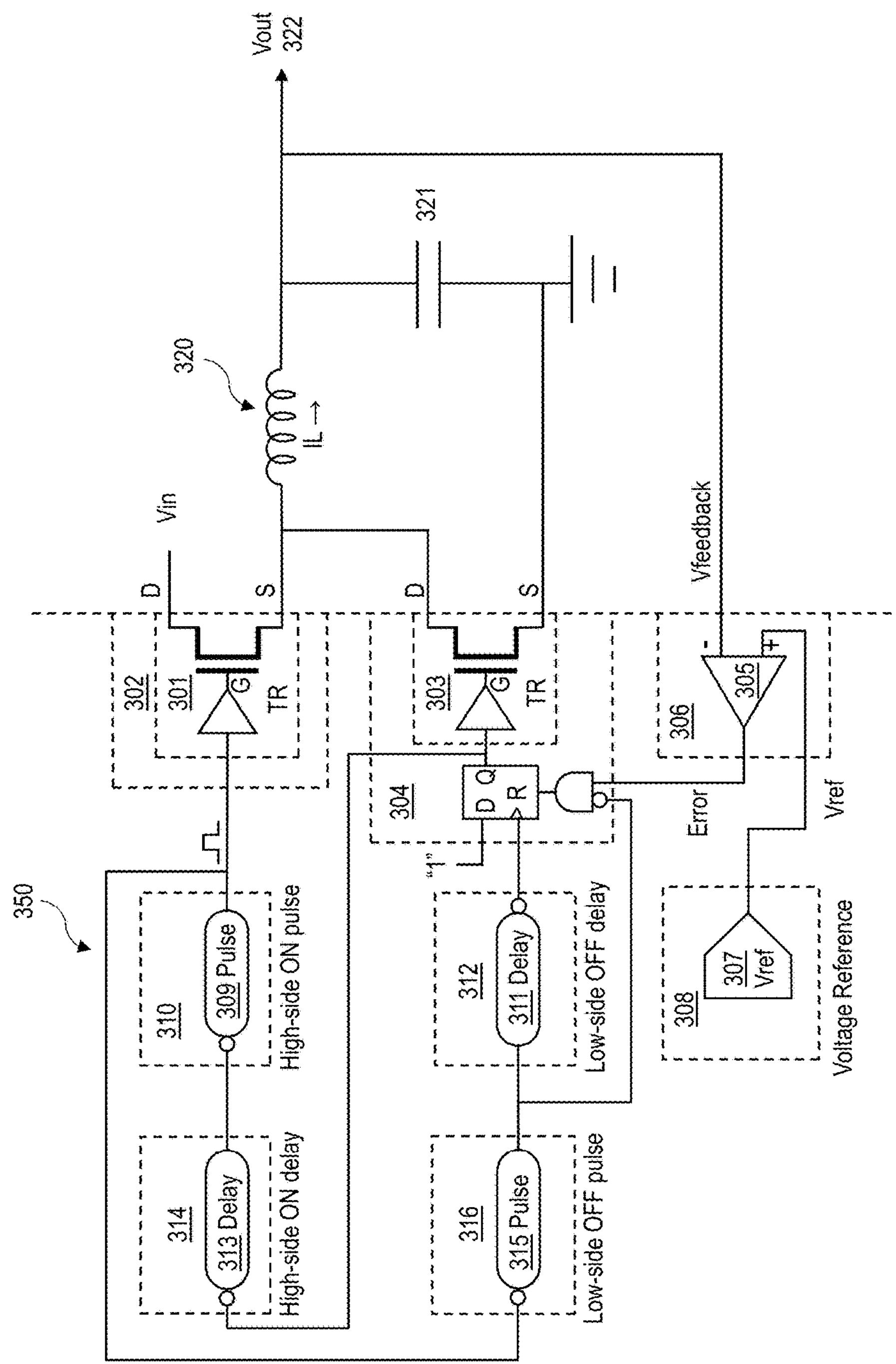
FIG. 3A illustrates a schematic diagram of an example hysteretic mode buck switching converter, according to one embodiment.
Figure 3B:
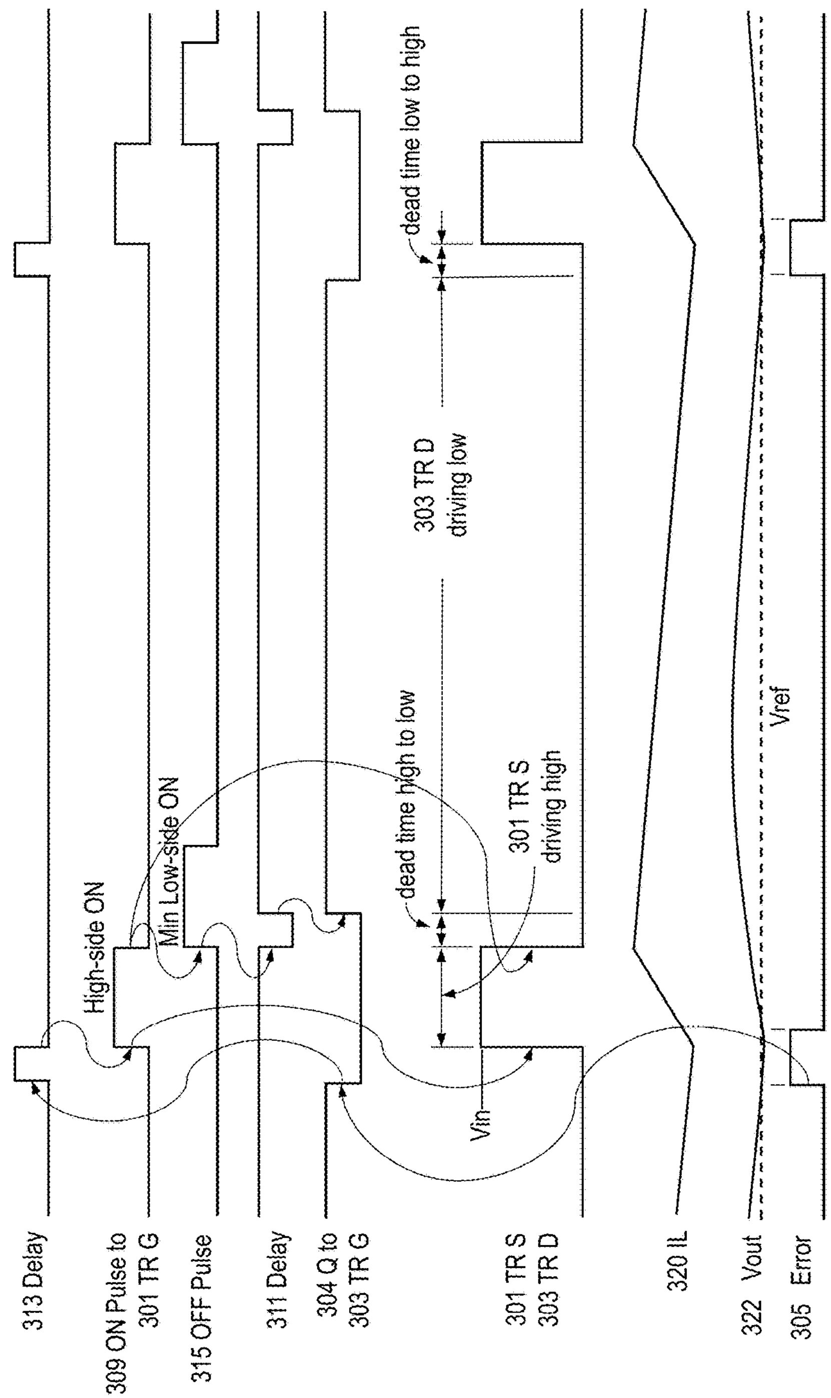
FIG. 3B is a signal diagram for the example hysteretic mode buck switching converter of FIG. 3A.

FIG. 3A illustrates a schematic diagram of an example hysteretic mode buck switching converter, according to one embodiment. The hysteretic mode buck switching converter shown in FIG. 3A may also be referred to as a bang-bang buck switching converter. FIG. 3B is a signal diagram for the example hysteretic mode buck switching converter of FIG. 3A. Although the present example shows an example of the analog and digital adaptive platform configured as a hysteretic mode buck switching converter, it is understood that the present adaptive platform can be configured as other devices including, but not limited to, a voltage-mode buck switching converter, a current-mode buck switching converter, a boost regulator, a buck-boost regulator, a low drop-out (LDO) regulator, a load switch, a mux, a battery charger, an external switching controller, a gate driver, and an integrator combining one or more thereof.

The programmable fabric can include a plurality of adaptive blocks, 301, 303, 305, 307, 309, 311, 313, and 315, each of which wrapped with respective signal wrappers 302, 304, 306, 308, 310, 312, 314, and 316. Among the adaptive blocks, the adaptive blocks 301 and 303 are high voltage power transistor blocks, the adaptive block 305 is a comparator block, the adaptive blocks 309, 311, 313, and 315 are timer blocks, and the adaptive block 307 is a voltage reference block.

Each of the high voltage power transistor blocks (e.g., the high voltage power transistor blocks 301 and 303) can be programmed for a specific target application and configured as, for example, but not limited to, a switcher, a linear operator, a current sense, and a protector. In the present example, the high voltage power transistor blocks 301 and 303 are programmed and configured as a switcher driving a high current output.

The comparator block 305 is configured to compare a voltage difference between an internal reference from the voltage reference block 307 and an external analog I/O signal $V_{feedback}$.

A timer block (e.g., the timer blocks 309, 311, 313, and 315) can be programmed to generate nanosecond, microsecond, and millisecond delays or pulses. The timer block can provide a precision dead-time control for improved efficiency. In the present example, the timer blocks 309 and 315 provide a constant-on-time pulse, and the timer blocks 311 and 313 are timers with a fixed delay specified by configuration.

A voltage reference block (e.g., the voltage reference block 307) can be used to provide a digitally-adjustable precision voltage reference. The voltage reference block can also provide protection for over current (OCP), over voltage (OVP), over temperature protection (OTP), under voltage-lockout (UVLO) references. In the present example, the voltage reference block 307 provides a fixed voltage reference specified at configuration, which provides the desired output voltage, $V_{ref}$.

The high voltage power transistor blocks 301 and 303 can drive the filter inductor 320 and the capacitor 321 in a synchronous mode as described in the signal diagram of FIG. 3B. The feedback voltage, $V_{feedback}$, from the filter output 322, $V_{out}$, is externally connected to the comparator block 305. The comparator block 305 compares the feedback voltage $V_{feedback}$ with a reference voltage, $V_{ref}$ to produce an error signal, Error=true if $V_{ref} \geq V_{feedback}$, or false if $V_{ref} < V_{feedback}$. The reference voltage, $V_{ref}$ is supplied from the voltage reference block 307 interconnected with the signal wrapper 308 and the signal wrapper 306 via the programmable fabric 350.

When the error signal 305 is true, the D-type flip-flop in the signal wrapper 304 is reset to turn off the high voltage power transistor block 303 and start the delay timer block 313. After this delay, the timer block 309 generates a constant-on-time pulse to turn on the high voltage power transistor block 301 through the connection made with signal wrapper 310 and signal wrapper 302 via the programmable fabric 350. The high voltage power transistor block 301 drives the inductor 320 to charge the output capacitor 321. When the pulse is completed, the falling edge of the pulse starts the minimum low-side ON pulse of the timer block 315 and sets the D-type flip-flop in the signal wrapper 304 after a fixed delay determined by the timer block 311 as shown in the signal diagram of FIG. 3B through the connection established with the signal wrapper 312 and the signal wrapper 304, and the connection established with the signal wrapper 310 and the signal wrapper 316 via the programmable fabric 350. The fixed delay is specified to ensure that the high-drive voltage power transistor block 301 is off, dead time, before the low-drive high voltage power transistor block 303 is turned on, preventing momentary shoot-through current as shown in the signal diagram of FIG. 3B. The D-type flip-flop in the signal wrapper 304 turns on the high voltage power transistor block 303 driving the inductor 320 to discharge the output capacitor 321.

The next cycle begins by first tuning off the low-side high voltage power transistor block 303 with a fixed delay reset pulse from the timer block 313 where the fixed delay is specified to ensure that the low-drive high voltage power transistor block 303 is off, dead time, before the high-drive voltage power transistor block 301 is turned on by the timer block 309, again, preventing momentary shoot-through current as shown in the signal diagram of FIG. 3B.

Figure 4:
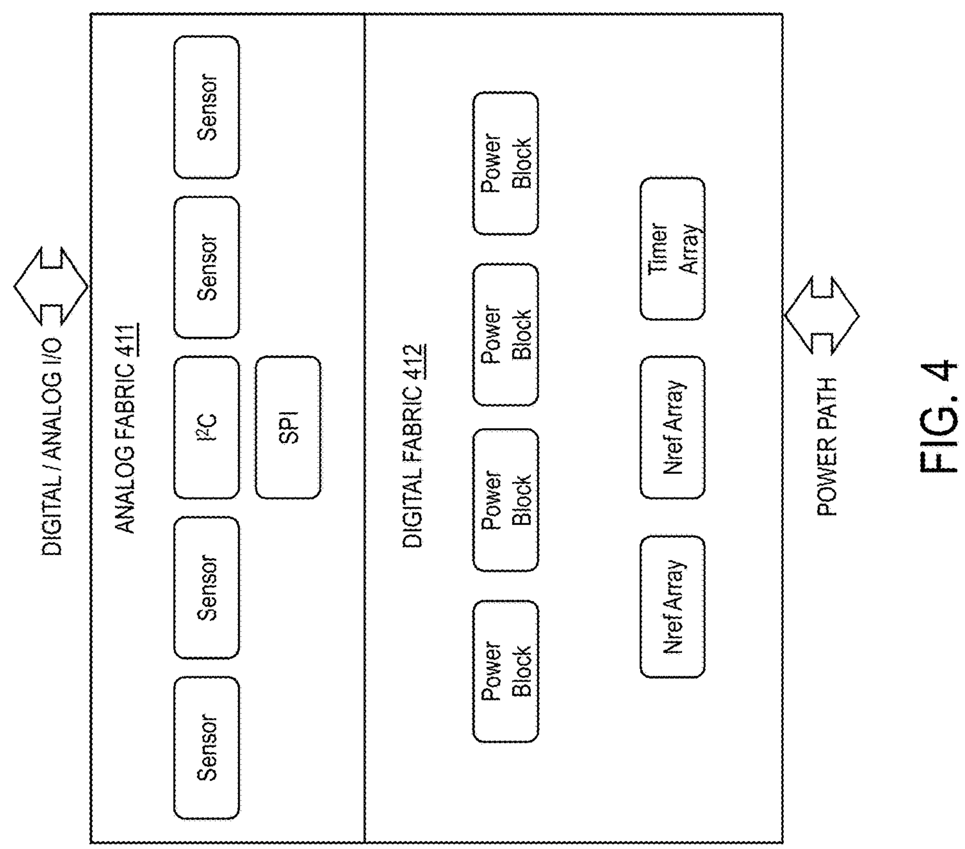
FIG. 4 shows a block diagram of an exemplary programmable logic device, according to one embodiment.

FIG. 4 shows a block diagram of an exemplary programmable logic device, according to one embodiment. The programmable fabric 101 of FIG. 1 may include an analog fabric 411 and a digital fabric 412. The analog fabric 411 corresponds to a portion of the programmable fabric 101 to provide analog interfaces with one or more external telemetry and sensor blocks, an I2C interface, an SPI interface, etc. The digital fabric 412 corresponds to a portion of the programmable fabric 101 that provides digital interfaces among the constituent blocks including the high voltage power transistor blocks 103, and the digital functional blocks 105 including a voltage reference (Nref array) and a timer array. For example, the digital fabric 412 can provide a power path and the connectivity among the integrated analog blocks, digital logic elements, timer arrays, I/O blocks, etc.

It is noted that FIG. 4 is only an example of the present PLD, and it is understood that the present PLD can include any number of power and sensor blocks, for example, four, eight, and twelve power and sensor blocks, and any type of digital and/or analog I/O interfaces without deviating from the scope of the present disclosure.

The present PLD can provide a software-defined and programmable, configurable, and optimizable power MOSFET. The present PLD including software-defined, programmable, and scalable power MOSFETs can accelerate time to market optimizable for new products and standards, accelerate competitive response, lower capital expenditure, operational expenditure, and inventory. The programming and configurability of the present PLD can be easily used to implement new ideas, solutions, and topologies.

The software component of the PLD can be programmed to configure various components, elements, and functions the PLD to configure the PLD as various types of regulators, switches, muxes, battery chargers, switching controllers, gate drivers, etc. Exemplary applications of the present PLD include, but are not limited to, a buck regulator (current or voltage-mode), a boost regulator, a multiphase buck regulator (current or voltage-mode), a buck-boost regulator (voltage-mode), a source side regulator, a drain-side regulator, a push-pull DDR regulator, a load switch, a battery charger (trickle constant current or constant voltage, power path).

The PLD can be configured as a power regulator and a power converter used for various power applications. The compensation memory block integrated in the PLD can programmably provide fine tuning of signals over a wide range with an accuracy and adaptability necessary for an intended application.

The present compensation memory block can be utilized in various target applications for the PLD. The present compensation memory block can provide a digital control loop that has various industrial, automobile, and power applications. The present compensation memory block can provide a digital control loop without analog circuit components for multipliers, thus save power and a surface area of the PLD. In addition, the present compensation memory block can be used to generate a non-linear control. The present compensation memory block can serve as a digital filer for signal processing application as well.

In one embodiment, the present compensation memory block stores pre-populated data in one or more lookup tables. For a given error signal, the pre-populated data stored in the lookup tables are used to generate a desired control-loop output signal for a power application. The control loop implemented with the present compensation memory block is advantageous over conventional control loop logics because it does not require computing the output signal with multipliers, thus can improve the input/output (I/O) performance and efficiency while saving power consumption and surface area of the PLD. In some embodiments, the present compensation memory block can also be used for generating non-linear output signals. In addition, the compensation memory block can also serve as a digital filter for various signal processing applications. The present compensation memory block can be implemented with additional features such as a gain adjust, a range extension, a pole extension, etc. The control loop implemented with the present compensation memory block can be programmably configured to provide proportional (P), proportional-integral (PI), proportional-derivative (PD), or proportional-integral-derivative (PID) controls.

Figures 5A, 5B:
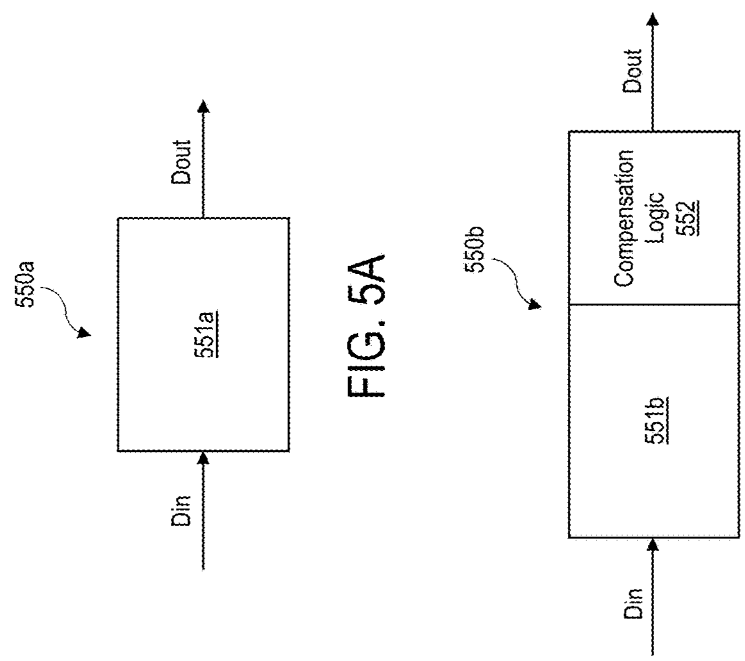
FIG. 5A shows a symbolic diagram of an example compensation memory block integrated in a PLD, according to one embodiment.
FIG. 5B shows a symbolic diagram of another exemplary compensation memory block including a compensation logic, according to one embodiment.

FIG. 5A shows a symbolic diagram of an example compensation memory block integrated in a PLD, according to one embodiment. The PLD can include more than one compensation memory block. Referring to FIG. 1, the compensation memory block can be included in the memory 117 of the programmable fabric 101 or a memory block contained in the digital functional blocks 105.

The compensation memory block **550*a* shown in FIG. 5A includes one RAM block 551*a*; however, it is understood that the compensation memory block 550*a* can include any number RAM blocks corresponding to the compensation scheme and/or the number of poles or zeros of the compensation filter, and/or an order of the system. The RAM block 551*a* is a static random-access memory (SRAM) block with a single input port for the input signal Din and a single output port for the output signal Dout. For example, the RAM block 551*a* can be a 4K memory block including a 256-words by 18-bit lookup table. The 256-words correspond to a resolution of the data stored in the RAM block 551*a*. For a given input signal Din, for example, an error voltage of an output signal of a regulator, the RAM block 551*a* output is a precomputed product of the voltage error input multiplied by a predetermined constant c. The calculation of the product is done within the compensation memory block by looking up a corresponding row in the lookup table for a given input instead of calculating an actual product and performing I/Os using an arithmetic logic external to the compensation memory block. For a range of error inputs expected in a target application, the data of the lookup table can be pre-populated dynamically and programmably to cover not only the expected range of error inputs but also a broader range of error inputs using a shifting and mirroring of the input signals using the same lookup tables. For example, the resolution of the data stored in the RAM block 551*a*** is 1 mV, and the range of the input signal Din is 0-255 mV. Each row of the lookup table stores a precomputed product of the error voltage multiplied by the predetermined constant c. The size of data stored in each row of the lookup table may vary, for example a 18-bit data in the present example. The range of the output signal Dout can cover, therefore, is c*(0-255 mV).

The output signal Dout can be used for providing a digital compensation of the output signal of a regulator. Depending on the accuracy requirement of a target application, the size of the RAM block **551*a*** can be programmably and dynamically reduced or expanded. For example, when the PLD is configured for a target application (e.g., a buck regulator), the programmable fabric of the PLD can be programmed to use a predetermined constant c1 using a 4K memory block including a 256-words by 18-bit lookup table. The same PLD may be reconfigured for another target application (e.g., a boost regulator), and the programmable fabric of the PLD can be programmed to use a predetermined constant c2 using an 8K memory block including a 512-words by 18-bit lookup table.

Referring to FIG. 4, the digital fabric 412 can include one or more compensation memory blocks. The RAM block 551*a* can provide a single port memory to the digital fabric 412. Because the RAM block 551*a* is intrinsically volatile (i.e., data stored therein is eventually lost when it is not powered), the data in the RAM block 551*a* can be initialized with a set of data stored in a non-volatile memory of the PLD or with a set of data provided from an external device via I/O blocks of the PLD during or after the PLD is powered up and initialized.

FIG. 5B shows a symbolic diagram of another exemplary compensation memory block including a compensation logic, according to one embodiment. The compensation memory block 550*b* includes a RAM block 551*b* and a compensation logic 552. For example, the RAM block 551*b* is a 256-words by 18-bit SRAM block with a single input port for an input signal Din and a single output port. The RAM block 551*b* is expandable to a 512-words by 18-bit SRAM block. It is noted that the size of the RAM blocks 551*a* and 551*b* may be determined and dynamically configured based on a target application (e.g., a buck regulator, a boost regulator) of the PLD and/or the size of the RAM memory blocks available in the PLD.

The output of the RAM block 551*b* passes through the compensation logic 552. Here, the output of the RAM block 551 can include one or more precomputed products as explained above with reference to FIG. 5A. According to one embodiment, the compensation logic 552 provides proportional-integral-differential (PID) compensation of the output signal of a regulator. In this case, the RAM block 551*b* can include three lookup tables, each corresponding to a proportional loop, a derivative loop, and an integral loop of a PID compensator. The output signal Dout of the compensation logic 552 is fed to the digital fabric of the PLD to control an analog switch of the regulator. The details of the PID compensator will be discussed below with reference to FIGS. 6A through 8. Various parameters of the RAM block 551*b* are programmable via the programmable fabric of the PLD. Examples of the programmable parameters of the RAM block 551*b* include, but are not limited to, a size, a resolution, a constant used to generate the lookup table, and the number of lookup tables to use for the signal compensation.

The compensation memory block 550*b* can provide PID compensation of error signals using the integrated compensation logic 552 without external passives or an arithmetic unit. The user can adjust a bandwidth, a gain, and a phase margin of the compensation logic 551 via the signal wrapper associated with the compensation memory block 550*b*. For example, a user can interactively adjust the proportional gain Kp and the gains Fz1 and Fz2 (shown in FIG. 6B) to effectively adjust the derivative and integral gains Kd and Ki as well as the bandwidth and the phase margin.

According to one embodiment, the control loop is used to track a behavior and provide a non-linear control of a non-linear system whose response can be approximated with a series of linearized equations. These linearization equations are typically evaluated in a set of operating points that capture key modes of the operation. Linear controllers are then synthesized for the system in the key points. The present compensation memory block can store a plurality of linear controller coefficients in the RAM block 551*b* reducing number of logics required to implement a non-linear controller using parallel logics.

According to one embodiment, the compensation memory block has configurable coarse/fine windowing options. For example, the minimum fine window and minimum coarse windows are 64 or 128. The multiple granularity windows can reduce the size of the compensation memory block while providing an efficient PID compensation of the signal. The windowing options can be programmed through the programmable fabric and the signal wrapper of the compensation memory block 550*b*.

According to one embodiment, the PID compensation logic 552 provides a digital control compensating the error voltage using a digital filter. The digital filter is programmable using the programmable fabric of the PLD. The required number of poles and zeros in the digital filter depends on a target application. For example, for a voltage-mode buck regulator, two zeros are needed to compensate for the second-order power stage, and a pole needs to be located at the origin to minimize a steady-state error.

According to one embodiment, the present compensation memory block has a dynamic clocking system that can reduce a delay between the input error and output control signals. For example, the flip-flop 823 shown in FIG. 8 can contain the last-stage computed value that is based on the error magnitude Emag[7:0] received at the RAM 811, while the flip-flops 816, 817, and 817 may be pre-computed.

The digital filter employed by the compensation logic 552 can be expressed as the following discrete time-domain difference equation:

$$P[n]=P[n-1]*a1+P[n-2]*a2+E[n]*a+E[n-1]*b+E[n-2]*c,$$

where n is a discrete time of the digital filter in a time domain, and P[n] is a duty cycle. The duty cycle P[n] is a pulse width of the high-side switch in a voltage mode operation or a target peak current in a current mode operation. The error signal E that is input to the compensation logic 552 is defined as a difference between a reference voltage Vref and the output voltage Vout, E[n]=Vref−Vout[n]. The output voltage Vout refers to an output signal of a regulator (e.g., a high voltage power transistor block) that is regulated against the reference voltage Vref.

Figure 6A:
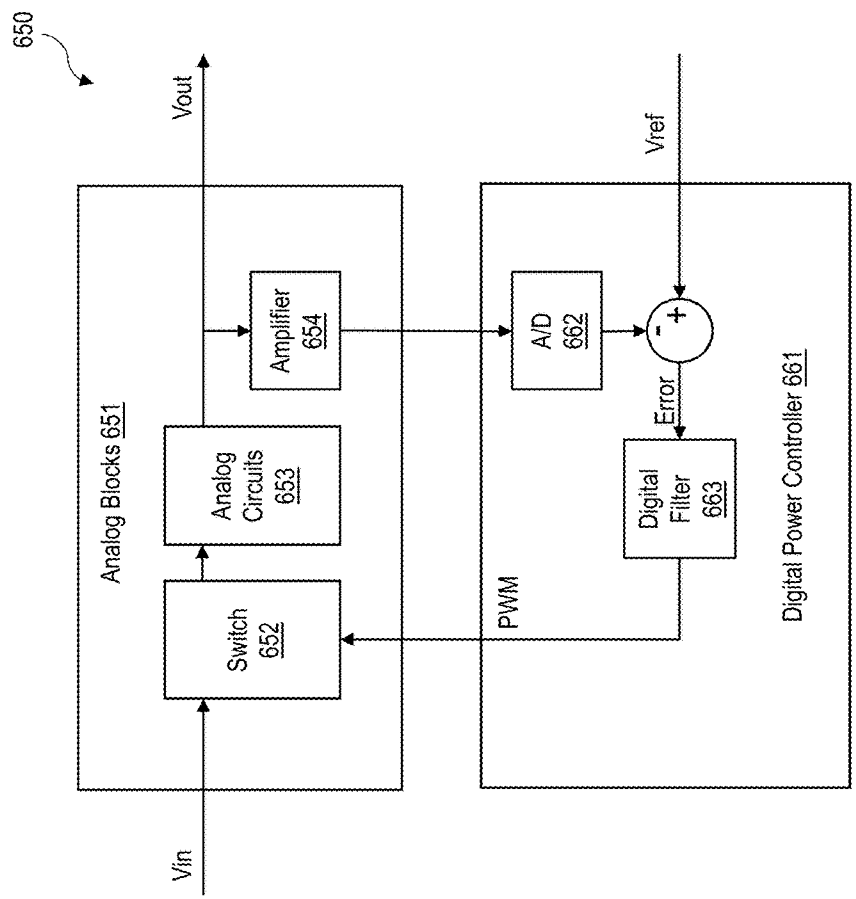
FIG. 6A shows a block diagram of an example regulator including a digital power controller, according to one embodiment.

FIG. 6A shows a block diagram of an example regulator including a digital power controller, according to one embodiment. The regulator 650 includes analog blocks 651 and a digital power controller 661. The analog blocks 651 includes a switch 652 (e.g., a high voltage power transistor), analog circuits 653 and an amplifier 654. The switch 652 receives PWM signals generated by the digital power controller 661 to convert an input voltage Vin to provide a regulated output voltage Vout with respect to a reference voltage Vref. The analog circuits 653 may be external to the PLD. The compensation memory block can be included in the digital filter 663.

The digital power controller 661 includes an A/D converter 662 and a digital filter 663. The analog signal of the output voltage Vout is converted to a digital signal using the A/D converter 662 of the digital power controller 661 and fed to the digital filter 663. The digital filter 663 generates the PWM signal to controller the switch 652 of the analog blocks using the present compensation memory. According to one embodiment, the regulator 650 is a buck regulator if the input voltage Vin is higher than the output voltage Vout. According to another embodiment, the regulator 650 is a boost regulator if the output voltage Vout is higher than the input voltage Vin.

The constants a1 and a2 are determined based on a pole compensation scheme of the digital filter 663. The pole compensation scheme is also programmable via the programmable fabric of the PLD. For example, for one-pole compensation, a1 is set to 1, and a2 is set to 0. For two-pole compensation, both a1 and a2 are set to 0.5. It is noted that any other pole compensation scheme may be used without deviating from the scope of the present disclosure.

Figure 6B:
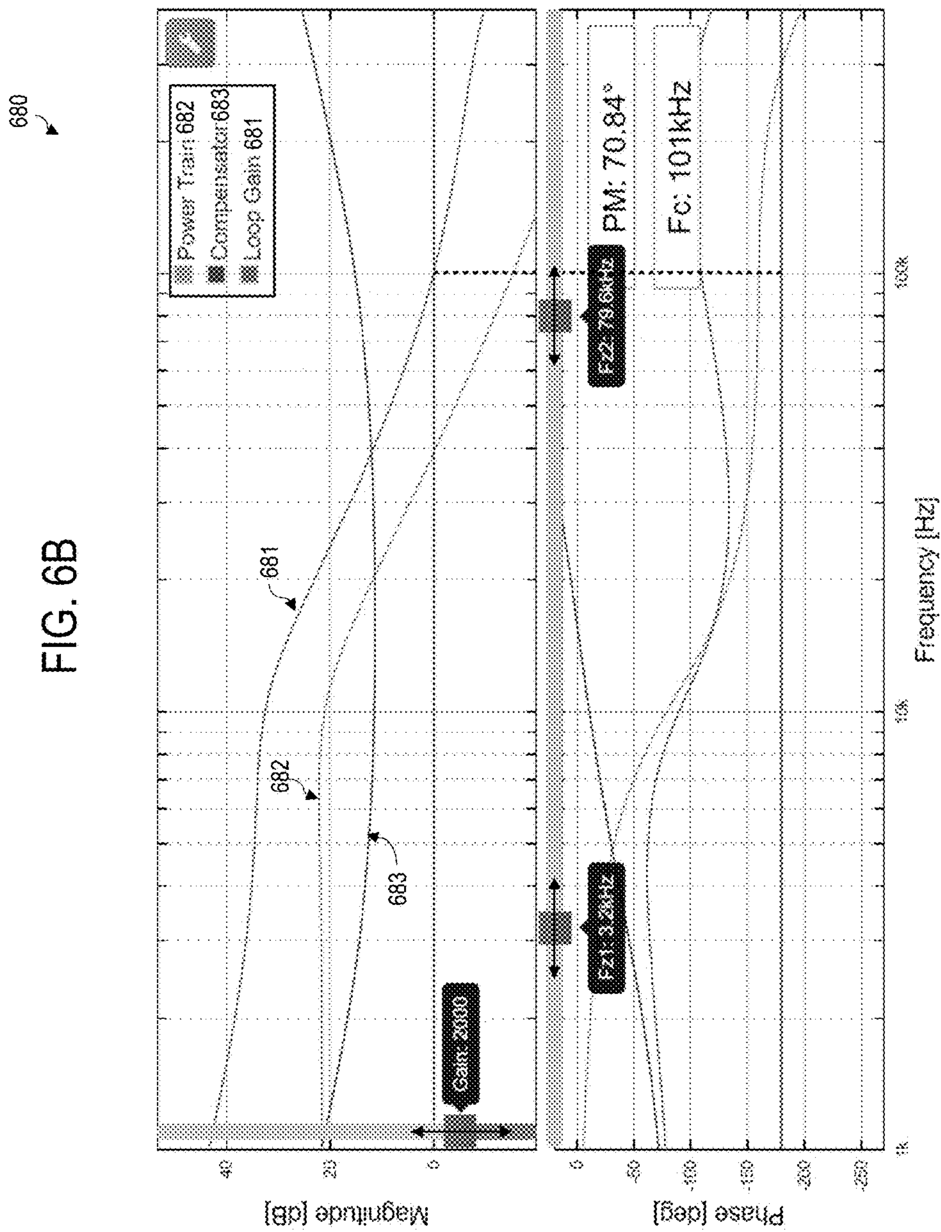
FIG. 6B show a Bode plot of the example regulator of FIG. 6A.

FIG. 6B show a Bode plot of the example regulator of FIG. 6A. In a closed loop system, a feedback control loop implemented using the compensation memory block requires a stability analysis of the system. For a linear system, the stability analysis can be done by determining an open loop gain and plotting its magnitude and phase in a Bode plot. From the Bode plot, the system's performance metrics including a bandwidth (0 dB crossover), a gain margin, and a phase margin can be determined.

The Bode plot 680 shows a bandwidth, a gain, and a phase margin according to Kp=Gain, Ki=2pi*Kp*Fz1, and Kd=Kp/(2pi*Fz2). A user can adjust the proportional gain Kp as well as the gains Fz1 and Fz2 to achieve a desired phase margin (e.g., a phase margin being greater than 45 degrees) and a crossover frequency Fc being less than one tenth the switching frequency Fsw. In one embodiment, the Bode plot 680 is provided to a user as a graphical user interface in which the user can move the proportional gain Kp up and down to change the value, and the gains Fz1 and Fz2 horizontally, and the calculated phase margin and the crossover frequency Fc are updated accordingly.

Figure 7:
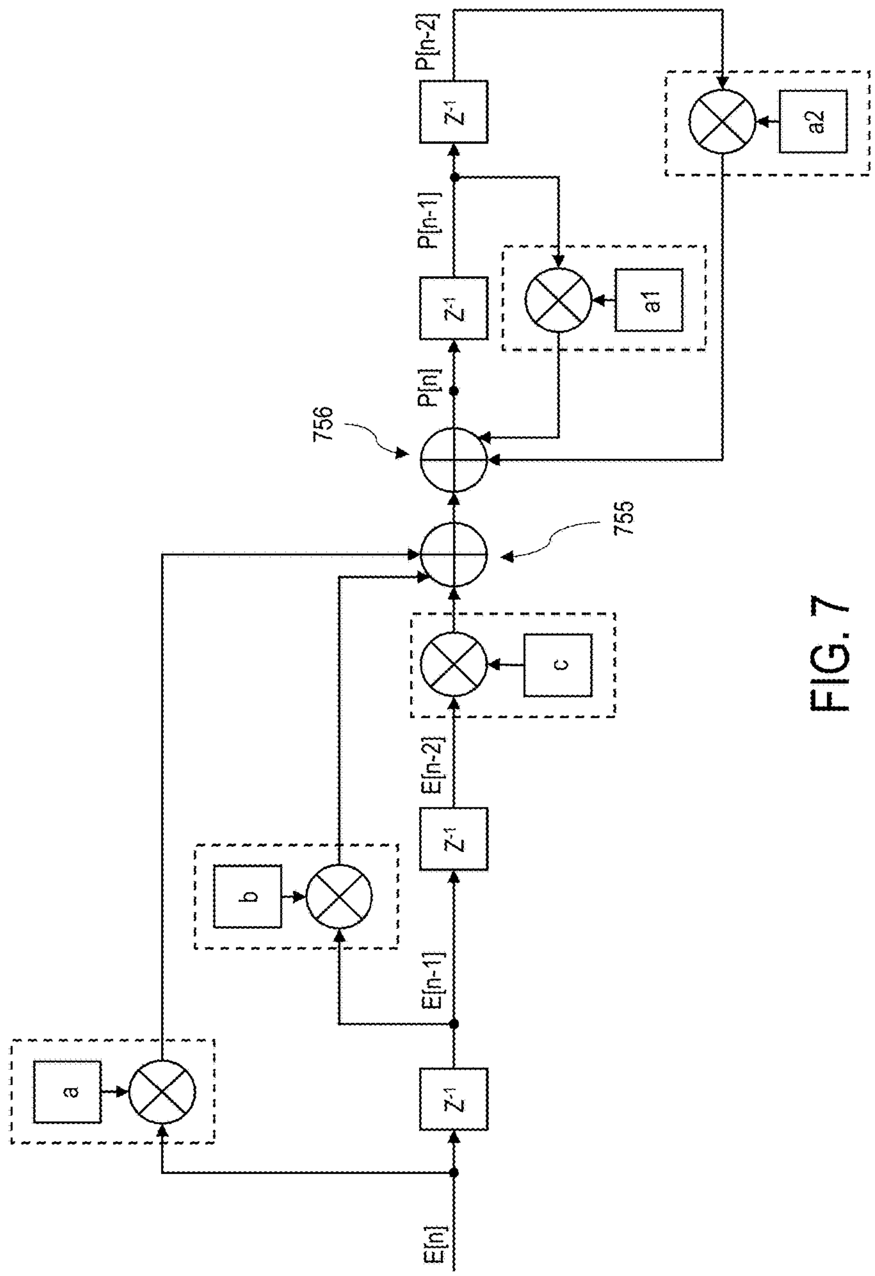
FIG. 7 shows a block diagram of an example PID digital filter, according to one embodiment.

FIG. 7 shows a block diagram of an example PID digital filter, according to one embodiment. The block $Z^{-1}$ denotes a delay operator. Referring to FIG. 5B, the compensation memory 550*b* stores a set of predetermined products, a*E[n], b*E[n−1], and c*E[n−2]. The precomputed set of products are added using adder blocks 755 and 756.

According to one embodiment, the precomputed set of products are stored in a lookup table in the RAM block of the compensation memory. In some embodiments, multiple compensation memory blocks can be cascaded to form a higher order (e.g., multi-zeros multi-poles) control loop system. In the case of a one-pole PID compensation where a1=1 and a2=0, the RAM block stores pre-computed products for each of E[n]*a, E[n−1]*b, and E[n−2]*c in three separate lookup tables. For an error input, for example, E[n], E[n−1], and E[n−2], the compensation memory block looks up the precomputed products of a*E[n], b*E[n−1], and c*E[n−2] instead of calculating their products using a computational resource. In the case of a more complex multipole compensation scheme, for example, two-pole compensation (a1=a2=0.5), the RAM block stores pre-computed products for each of E[n]*a, E[n−1]*b, and E[n−2]*c in respective lookup tables, and P[n−1], and P[n] are saved and shifted by 1-bit to perform the multiplication of a1*P[n−1] and a2*P[n], respectively. Therefore, the digital filter may not require registers, memory, and a processor for calculating the products. The constants, a, b, and c can be optimized for stability, regulation, and transient response for a target application of the PLD. The pre-computed data stored in each lookup table can be output data corresponding to a response that is selectable by a user, for example, a gain, a phase margin, and a cutoff frequency as shown in FIG. 6B. The selectable responses may also include, but are not limited to, a quick settling from a transient value to a final value, limiting bumps or load line responses. The constants a, b, and c are programmable by the programmable fabric of the PLD and can be dynamically loaded or updated. In some embodiments, the RAM block can store non-linear data for providing a non-linear control instead of storing precomputed products. In another embodiment, the constants a, b, and c can change and adjust according to the history of the system dynamics to provide an adaptive control. The adjustment of the constants a, b, and c can be achieved by applying predefined rules or formulae to the input signals or other data. Such adjustment or adaptive control can include, but are not limited to, gain scheduling, model-reference adaptive systems, and stochastic regulators.

Figure 8:
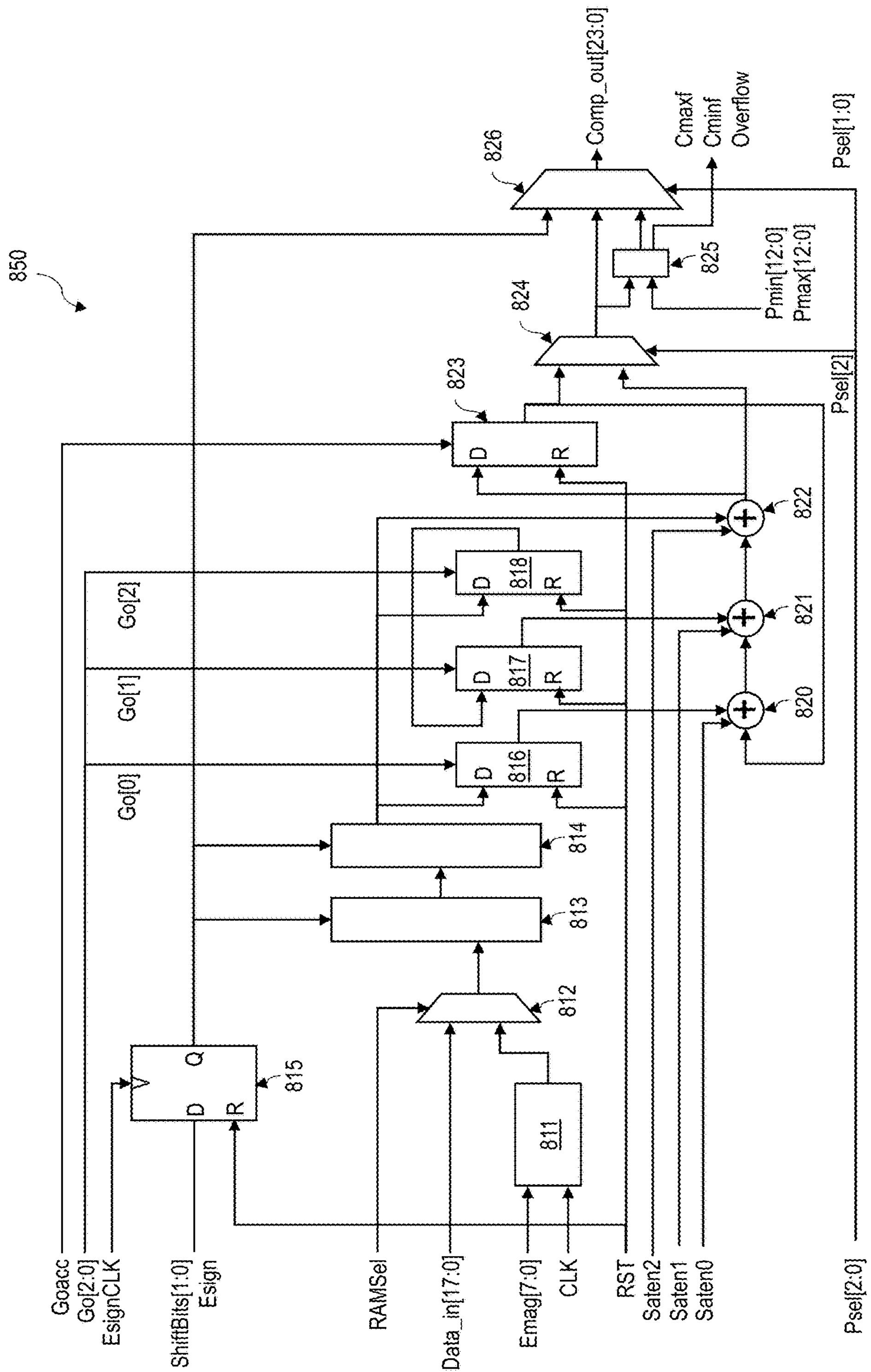
FIG. 8 shows a simplified circuit diagram of an example compensation memory block, according to one embodiment.

FIG. 8 shows a simplified circuit diagram of an example compensation memory block, according to one embodiment. The compensation memory block 850 receives a plurality of signals from the digital fabric of the programmable fabric. Goacc is a clock signal to load a register accumulator 823. Go[2:0] are clock signals to load registers 816, 817, and 818. The load registers 816, 817, and 818 are loaded with products from the RAM 811. For example, the RAM 811 one or more lookup tables that are identified by their unique address in response to the input Data_in. EsignCLK is a clock signal to load a ShiftBits register 815. ShiftBits[1:0] and Esign are shift and error polarity signal to be loaded into the ShiftBits register 815. More than one compensation memory blocks 850 can be combined or cascaded to form a higher resolution or higher order system. In one embodiment, three compensation memory blocks 850 may be cascaded where each RAM 811 in the individual compensation memory block 850 stores the constants a, b, and c separately, and the output of each compensation memory block 850 are combined to form a combined compensation output signal, thus creating a high order and/or high resolution system.

RAMSel is an input signal to a RAM output data selector 812 that can select an internal or an external RAM. Data_in[17:0] are 18-bit input signals to the compensation memory block 850. Data_in[17:0] includes an address of a lookup table based on the error magnitude Emag[7:0]. The error magnitude Emag[7:0] is 8-bit input data corresponding to a digitized error. For example, the error magnitude Emag[7:0] is a positive value loaded to the RAM 811. A negative error can be processed using the positive error magnitude Emag[7:0] with the error sign Esign. For example, the RAM 811 is a 256×18 single port static RAM. CLK is a clock signal to load the RAM address. RST is a reset signal for the registers 815, 816, 817, 818, and the register accumulator 823. Saten0, Saten1, and Saten2 are signals that enable saturation of the adders 820, 821, and 822, respectively. Psel[2:0] are compensation output data select signals.

The circuit component 813 is a shift operator. The circuit component 814 is a 2's complement operator. The register 816 stores a*E[n], the register 817 stores b*E[n−1], and the register 818 stores c*E[n−2]. Here, the error signal E[n] and the delayed error signals E[n−1] and E[n−2] denote the outputs from the shift operator 813 and the 2's complement operator. The register accumulator 823 stores the PID data that are generated at the output of the adder 822. A multiplexor 824 selects the PID data from the register accumulator 823 or the adder 822. A register 825 stores and maximum and minimum output clipping signals Cmaxf and Cminf, and overflow signals. The signals out of the register 825 are fed to a multiplexor 826 to generate the 24-bit compensation output Comp_out[23:0]. The clipping feature serves as a protection mechanism for a PWM controlled power converter that limits the maximum and minimum duty cycle of the PWM signal.

The input and output signals from and to the programmable fabric as shown in FIG. 8 are collectively referred to as Din and Dout in the block diagrams of FIG. 5B. For example, Din of FIG. 5B can include Data_in[17:0] and Emag[7:0], and Dout of FIG. 5B can include the PID output Comp_out[23:0]. Referring to FIGS. 6A and 8, Din and Dout are contained in the digital filter 663, and the error signal E[n] corresponds to Din. The digital filter 663 computes P[n]=P[n−1]*a1+P[n−2]*a2+E[n]*a+E[n−1]*b+E[n−2]*c, where E[n]=Emag[7:0] (typically 5-7 bit signal) and P[n]=Comp_out[23:0].

The compensation memory has a built-in arithemetic scaling capability to adjust the accuracy needed to meet a control loop response. Arithmetic scaling revolves around the definition of a binary word and examination of the arithmetic operations on that word. For example, two-word definitions are possible: integer and fractional. The 18-bit wide memory block RAM 811 can be represented as a single signed 18-bit integer data. Alternatively, the 18-bit may represent a fractional value consisted of a 1-bit sign, 9-bit integer, and 8-bit fractional part. The precision and an accuracy of a control loop can be adjusted by changing the width (18-bit) of the data stored in the memory block RAM 811.

For example, the resolution of the data stored in the RAM block 551*a* is 1 mV, and a range of input signal Din is 0-255 mV. In this case, the programmable fabric routes an 8-bit RAM address Emag[7:0] to the RAM 811 of the compensation memory 850. Depending on an error falling in either the fine or coarse window, a 6-bit RAM address is used to select the granularity of the fine or coarse windowing. For example, a fine windowing has a granularity 64, and a coarse windowing has a granularity 64. The granularity 64 means plus or minus 64 mV for a fine windowing and plus or minus 512 mV for a coarse windowing. In addition, the programmable fabric routes the 2-bits of address ShiftBits[1:0] specifying a corresponding look-up table among the lookup tables stored in the compensation memory block (e.g., E[n]*a, E[n−1]*b, or E[n−2]*c), a fine/coarse windowing signal to specify the shifting bits of the 6-bit shift operator 813, and an error sign Esign to the 2's complement operator 814.

Referring to FIG. 5B, the output signal Dout of the compensation logic 552, herein also referred to as a PID signal, is a digital value representing a duty cycle (pulse width) of a pulse width modulation (PWM) signal in a voltage mode. In a current mode, the PID signal represent a maximum current over which the switch of the regulator is turned off. The PWM signal can be used to drive a switch of a regulator (e.g., a high voltage power transistor block). FIG. 6A shows that the output of the digital filter 663 included in the compensation logic 552 generate the PWM signal to drive the switch 652 of the regulator 650. Depending on the user's programming, the PLD can function as various types of regulators, for example, a buck regulator, a boost regulator, and/or a multi-phase regulator, and different programmably digital filtering scheme may be employed depending on the configuration of the PLD.

The present PLD can support both synchronous and asynchronous options for the PWM modulation. According to one embodiment, the compensation of the PWM signal can operate in either a voltage-mode or a current-mode. In the voltage-mode, a precision modulator timer (PMT) block (e.g., a timer array in FIG. 4) integrated the PLD can control the PWM pulse-on time. In the current-mode, the current sense DAC of a high voltage power block (e.g., a high voltage power transistor block contained in the high voltage power transistor blocks 103 in FIG. 1 or a power block in FIG. 4) can control the PWM pulse-on time. The characteristics of the PWM signal such as an amplitude (in voltage), a pulse width (or duty cycle) can be controlled by the programmable fabric.

According to one embodiment, the present compensation memory block can provide a soft-start. During a transient period after start-up, an error signal may be limited to its maximum value, and a duty ratio of the output PWM signal can slowly increase from zero toward a steady-state value.

According to one embodiment, the compensation memory block can reduce a memory space required for providing PID compensation and improve the efficiency of computation using the lookup table. The lookup table can store pre-computed data for generating a control output signal. In some embodiments, the lookup table can be used for generating an output for a nonlinear system. In one embodiment, the compensation memory block can be configured using a memory space available in a standard FPGA SRAM integrated in the PLD. In some embodiments, a non-FPGA SRAM may be used. However, I/O pins to the non-FPGA SRAM are required, and I/O operations to the non-FPGA SRAM are costly because they require an external I/O to the non-FPGA SRAM. The output from the compensation memory block can be optimized to be closely aligned with the needs and requirements of the point-of-load (POL) that the PLD provides.

According to one embodiment, the compensation memory block can shift the resolution between fine and coarse windowing. For example, the shifting can be performed using the ShiftBits register 815. For example, when an ADi block is switched from a fine 1 mV resolution to a coarse 64 mV resolution, the same look-up table may be used by shifting the result by 6-bits. Similarly, the same look-up table may be used for both positive and negative numbers by 2's by complementing the result and halving the bit requirement to cover both positive and negative input signals. The compensation memory block can have a regular register/address structure for providing flexibility, for example, one-POL and two-POL compensator. Each of the compensation memory blocks can provide an independent compensator sharing no resources for computation (e.g., multiplication, shifting errors). The compensation memory block can have a full bandwidth for stability.

For example, the compensation memory block includes a lookup table of 256-words by 18-bits that stores products (e.g., a*E, b*E, and c*E) corresponding to an error input in a fine range (e.g., −31 mV to 31 mV). The compensation memory block includes a shift register for accommodating a shift bit, for example, 2-6 bits. Using the shift register, an input error out of the fine range can be obtained by shifting input error by the shift bit to cover a coarse range of the error inputs (e.g., 0V to 1,024 mV) For a negative input error, the compensation memory block subtracts the product for the negative error instead of adding. The symmetry of the lookup table can reduce the size of the RAM block required to cover a negative fine range (e.g., 0 mV to −31 mV). The negative coarse range of the errors can be similarly covered by the changing the sign (subtraction instead of addition) of the product.

With dual ADi blocks used, both fine and coarse error results can be computed simultaneously. If the coarse error is zero, then the fine result is used. If the coarse error is not zero, then the coarse result is used, and the products (a*E, b*E, c*E) are shifted in shifter 813 by the number of bits corresponding the coarse setting (e.g., 5 bits for 32 mV coarse setting). If the error is negative, then the result is negated in 2's complement block 814. The products, b*En−1, c*En−2, and c*En−1 are saved in the registers 816, 817 and 818, respectively. The PID sum is accumulated in the register accumulator 823 from the adders 820, 821 and 822.

The PID sum is then routed through the multiplexors 824 and 826 to the output Comp_out[23:0].

According to one embodiment, the memory block RAM 811 may include a plural set of lookup tables to support multiple plants system. The compensation output signal for each plan system can be output by referring to each set of lookup tables sharing the same registers, adders, and other internal logics to generate multiplexed compensation output signal. This might be useful for time/performance insensitive systems with limited resources or chip space.

Figure 9:
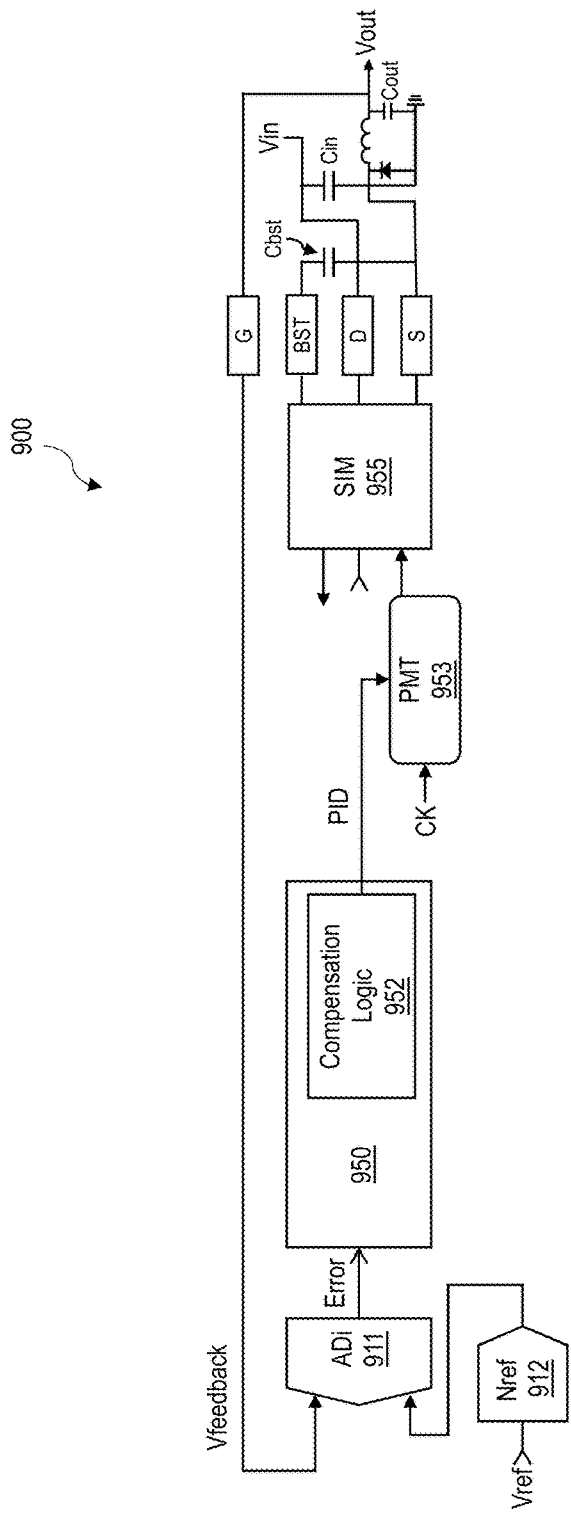
FIG. 9 shows a simplified circuit diagram of a voltage-mode regulator, according to one embodiment.

FIG. 9 shows a simplified circuit diagram of a voltage-mode regulator, according to one embodiment. The present example shows an asynchronous buck regulator 900. The asynchronous buck regulator 900 includes an adaptive error digitizer block 911 (herein also referred to as an ADi block), a voltage reference block 912 (herein also referred to as an Nref block), a compensation memory block 950, a precision modulation timer (PMT) block 953, and a high voltage power transistor block 955 (herein also referred to as a SIM block). The feedback voltage Vfeedback is compared against a reference voltage Vref supplied by the Nref block 912 of the PLD using the ADi block 911. The ADi block 911 produces a digital error that is fed to the compensation memory 950 including an integrated compensation logic 952. The calculated PID value (a sum of the three products E[n]*a, E[n−1]*b, and E[n−2]*c) controls the PMT 953 by setting the PWM pulse width of a duty cycle. The PMT 953 controls the switch of the SIM block 955, turning it on or off as required to maintain the output voltage Vout at a constant voltage level.

Figure 10:
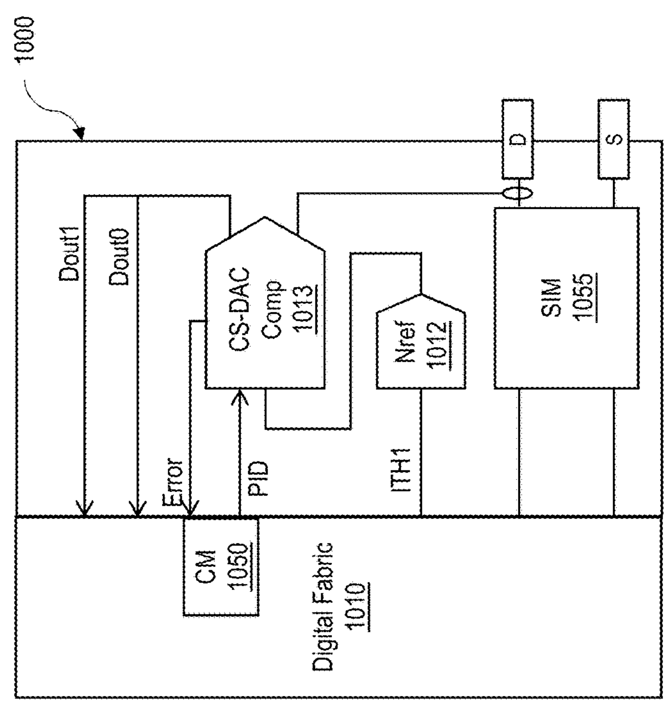
FIG. 10 shows a simplified block diagram of an integrated current-mode regulator, according to one embodiment.

FIG. 10 shows a simplified block diagram of an integrated current-mode regulator, according to one embodiment. The current-mode regulator 1000 interfaces with a digital fabric 1010 that provides connection of signals among blocks integrated in a PLD. The current-mode regulator 1000 includes a SIM block 1055, an Nref block 1012, and a current-sensing DAC comparator block 1013. The current through the SIM block 1055 is compared against a current reference provided by the Nref block 1012. The CS-DAC comparator block 1013 compares the current reference from the Nref block 1012 and the current through the SIM block 1055 values and provides a current feedback control loop. The current feedback control loop of the current-mode regulator 1000 uses a compensation memory block 1050 and calculates a compensation value that feeds the CS-DAC comparator block 1013. The configuration shown in FIG. 10 provides current-mode regulator 1000 with digital compensation. According to another embodiment, the current-mode regulation can support over-current threshold protection and slope compensation.

Figure 11:
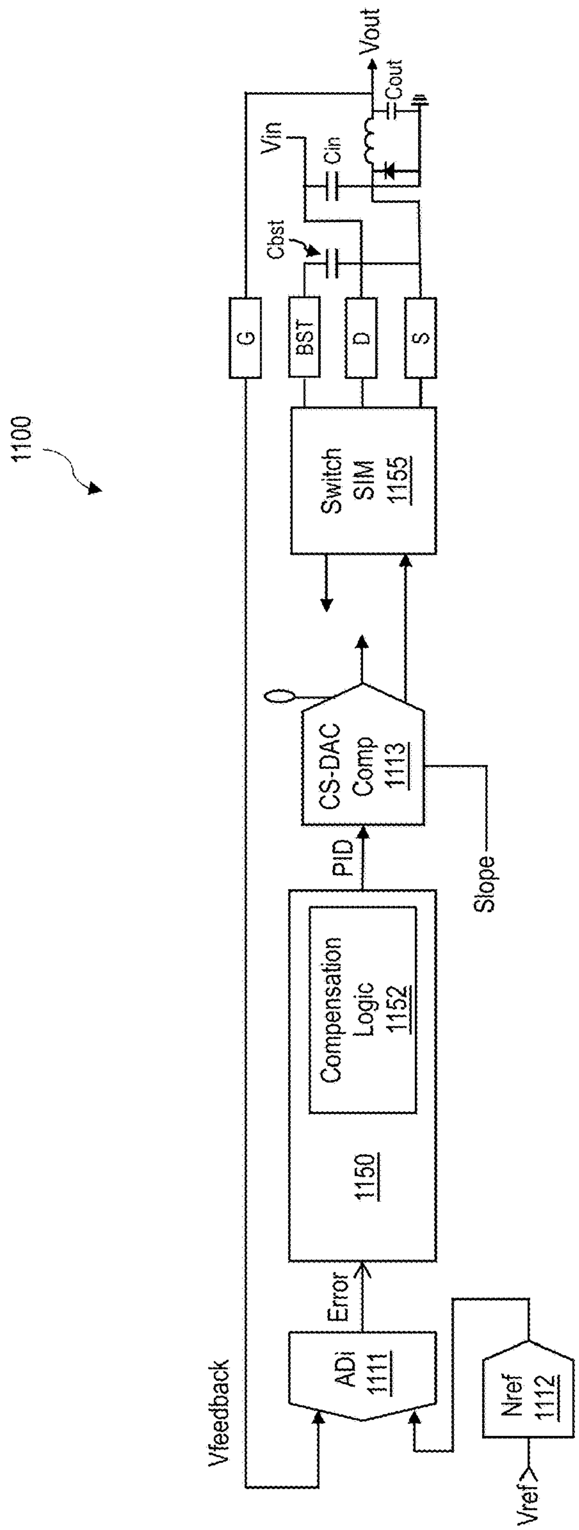
FIG. 11 shows a simplified circuit diagram of a current-mode regulator, according to one embodiment.

FIG. 11 shows a simplified circuit diagram of a current-mode regulator, according to one embodiment. As in the voltage-mode control loop discussed above with reference to FIG. 9, the present example shows an asynchronous buck regulator 1100 operating in a current mode. The asynchronous buck regulator 1100 includes an adaptive error digitizer block 1111 (herein also referred to as ADi block), a voltage reference block 1112 (herein also referred to as an Nref block), a compensation memory block 1150, a current-sensing DAC comparator (CS-DAC) block 1113, and a high voltage power transistor block 1155 (herein also referred to as a SIM block). The feedback voltage Vfeedback is compared against a reference voltage Vref supplied by the Nref block 1112 using the ADi block 1111. The ADi block 1111 provides an error signal that is fed to the compensation memory block 1150 including an integrated compensation logic 1152. In the current-mode regulation, the calculated PID signal from the compensation memory 1150 is fed to the CS-DAC comparator block 1113. The PID signal that drives the CS-DAC comparator block 1113 has a specific value of current at which the switch is turned off. That current value to turn off the switch can be modified by a slope compensation ramp depending on when the threshold is reached during the PWM cycle. The high-side switch can be turned on at the beginning of a PWM cycle. The pulse width is determined by the CS-DAC comparator block 1113, and the CS-DAC comparator block 1113 turns the switch SIM 1115 off when the target PID current value is reached, thus regulating the inductor current to achieve the Vfeedback with a minimum error signal. The CS-DAC block 1113 compares the current flowing through the regulator 1100 against the PID signal to control a switch of the SIM block 1115 and turn it off as required to maintain a minimum error at the output signal Vout.

A method includes: receiving error signals from a signal wrapper of a programmable fabric, wherein the programmable fabric and the signal wrapper are integrated in a programmable logic device (PLD); looking up one or more lookup tables storing rows of pre-calculated data and obtaining a matching pre-calculated data corresponding to the error signals; and generating a compensated output signal using the matching pre-calculated data to drive a switch of the power regulator. The pre-populated data stored in the one or more lookup tables are programmably changed by programming a plurality of parameters of the programmable fabric and loading the pre-populated data to the one or more lookup tables via the signal wrapper.

The one or more lookup tables may be included in a memory block integrated in the PLD.

The error signals may be digital signals that are converted from analog error signals using an analog-to-digital converter (ADC).

The pre-calculated data stored in the one or more lookup tables may be a product of an error signal multiplied by a constant.

The PLD may include a high voltage power transistor, and the PLD may be configured as a regulator by configuring the high voltage power transistor. The compensated output signal may be a pulse width of a pulse-width modulation (PWM) signal of a digital filter for driving a switch of the high voltage power transistor.

The regulator may be one of a buck regulator, a boost regulator, a multiphase buck regulator, a buck-boost regulator, a source side regulator, a drain-side regulator, a push-pull DDR regulator, a load switch, and a battery charger.

The compensated output signal may be fed to the switch of the high voltage power transistor via a digital fabric of the programmable fabric.

The method may further include: providing an interactive user interface to adjust one or more gains of the digital filter.

A phase margin and a crossover frequency may be interactively adjusted by adjusting the one or more gains of the digital filter.

The method may further include: providing the compensated output signal to a current-sensing comparator block of the PLD to drive the switch of the high voltage power transistor.

The method may further include: turning off the switch of the high voltage power transistor using the current-sensing comparator block when a sensed current reaches a programmable threshold value.

The programmable threshold value may be modifiable using a programmable slope compensation ramp.

The pre-calculated data stored in the one or more lookup tables may be non-linear data corresponding to the error signals.

The error signals may be positive error signals, and the compensated output signal corresponding to negative error signals may be generated by obtaining 2's complement of the pre-calculated data.

The method may further include: shifting the pre-calculated data by a shifting bit to cover a broader range of error signals using the same one or more lookup tables.

The method may further include: clipping the compensated output signal between a minimum value and a maximum value using a register.

A data width of the pre-calculated data stored in the one or more lookup tables may be adjustable to change precision and accuracy of the compensated output signal.

The method may further include: providing a dynamic clocking system to reduce a delay between the error signals and the compensated output signal using a flip-flop that contains a last-stage computed value.

The method may further include: cascading one or more compensation memory blocks that store the one or more lookup tables to generate the compensated output signal of a higher order.

The one or more lookup tables may include a first lookup table corresponding to a first range of the error signals and a second lookup table corresponding to a second range of the error signals, and the first range may be narrower than the second range.

The pre-calculated data stored in the one or more lookup tables are output data corresponding to a selectable response.

The above example embodiments have been described hereinabove to illustrate various embodiments of implementing a memory integrated in a PLD used for compensating signals in a power application. Various modifications and departures from the disclosed example embodiments will occur to those having ordinary skill in the art. The subject matter that is intended to be within the scope of the invention is set forth in the following claims.

What is claimed is:

1. A method comprising:

receiving error signals from a signal wrapper of a programmable fabric, wherein the programmable fabric and the signal wrapper are integrated in a programmable logic device (PLD);

looking up one or more lookup tables storing rows of pre-calculated data and obtaining a matching pre-calculated data corresponding to the error signals; and generating a compensated output signal using the matching pre-calculated data to drive a switch of a power regulator, wherein the pre-populated data stored in the one or more lookup tables are programmably changed by programming a plurality of parameters of the programmable fabric and loading the pre-populated data to the one or more lookup tables via the signal wrapper, and wherein the PLD comprises a high voltage power transistor, and the PLD is configured as the power regulator by configuring the high voltage power transistor, and wherein the compensated output signal is a pulse width of a pulse-width modulation (PWM) signal of a digital filter for driving a switch of the high voltage power transistor.

2. The method of claim 1, wherein the one or more lookup tables are included in a memory block integrated in the PLD.

3. The method of claim 1, wherein the error signals are digital signals that are converted from analog error signals using an analog-to-digital converter (ADC).

4. The method of claim 1, wherein the pre-calculated data stored in the one or more lookup tables is a product of an error signal multiplied by a constant.

5. The method of claim 1, wherein the power regulator is one of a buck regulator, a boost regulator, a multiphase buck regulator, a buck-boost regulator, a source side regulator, a drain-side regulator, a push-pull DDR regulator, a load switch, and a battery charger.

6. The method of claim 1, wherein the compensated output signal is fed to the switch of the high voltage power transistor via a digital fabric of the programmable fabric.

7. The method of claim 1, further comprising: providing an interactive user interface to adjust one or more gains of the digital filter.

8. The method of claim 7, wherein a phase margin and a crossover frequency are interactively adjusted by adjusting the one or more gains of the digital filter.

9. The method of claim 1, further comprising: providing the compensated output signal to a current-sensing comparator block of the PLD to drive the switch of the high voltage power transistor.

10. The method of claim 9, further comprising: turning off the switch of the high voltage power transistor using the current-sensing comparator block when a sensed current reaches a programmable threshold value.

11. The method of claim 10, wherein the programmable threshold value is modifiable using a programmable slope compensation ramp.

12. The method of claim 1, wherein the pre-calculated data stored in the one or more lookup tables are non-linear data corresponding to the error signals.

13. The method of claim 1, wherein the error signals are positive error signals, and the compensated output signal corresponding to negative error signals is generated by obtaining 2's complement of the pre-calculated data.

14. The method of claim 1, further comprising: shifting the pre-calculated data by a shifting bit to cover a broader range of the error signals using the one or more lookup tables.

15. The method of claim 1, further comprising: clipping the compensated output signal between a minimum value and a maximum value using a register.

16. The method of claim 1, wherein a data width of the pre-calculated data stored in the one or more lookup tables is adjustable to change precision and accuracy of the compensated output signal.

17. The method of claim 1, further comprising: cascading one or more compensation memory blocks that store the one or more lookup tables to generate the compensated output signal of a higher order.

18. The method of claim 1, wherein the pre-calculated data stored in the one or more lookup tables are output data corresponding to a selectable response.

19. A method comprising:

receiving error signals from a signal wrapper of a programmable fabric, wherein the programmable fabric and the signal wrapper are integrated in a programmable logic device (PLD);

looking up one or more lookup tables storing rows of pre-calculated data and obtaining a matching pre-calculated data corresponding to the error signals;

generating a compensated output signal using the matching pre-calculated data to drive a switch of a power regulator; and providing a dynamic clocking system to reduce a delay between the error signals and the compensated output signal using a flip-flop that contains a last-stage computed value, wherein the pre-populated data stored in the one or more lookup tables are programmably changed by programming a plurality of parameters of the programmable fabric and loading the pre-populated data to the one or more lookup tables via the signal wrapper.

20. A method comprising:

receiving error signals from a signal wrapper of a programmable fabric, wherein the programmable fabric and the signal wrapper are integrated in a programmable logic device (PLD);

looking up one or more lookup tables storing rows of pre-calculated data and obtaining a matching pre-calculated data corresponding to the error signals; and generating a compensated output signal using the matching pre-calculated data to drive a switch of a power regulator, wherein the pre-populated data stored in the one or more lookup tables are programmably changed by programming a plurality of parameters of the programmable fabric and loading the pre-populated data to the one or more lookup tables via the signal wrapper, and wherein the one or more lookup tables include a first lookup table corresponding to a first range of the error signals and a second lookup table corresponding to a second range of the error signals, wherein the first range is narrower than the second range.

* * * * *